United States Patent
Kang

(10) Patent No.: US 7,710,795 B2
(45) Date of Patent: May 4, 2010

(54) SEMICONDUCTOR MEMORY DEVICE

(75) Inventor: Khil-Ohk Kang, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 105 days.

(21) Appl. No.: 12/216,138

(22) Filed: Jun. 30, 2008

(65) Prior Publication Data

US 2009/0059683 A1 Mar. 5, 2009

(30) Foreign Application Priority Data

Aug. 30, 2007 (KR) ............ 10-2007-0087609

(51) Int. Cl.
G11C 7/06 (2006.01)
(52) U.S. Cl. ............ 365/189.07; 365/189.09; 365/189.11
(58) Field of Classification Search ............ 365/189.07, 365/189.09, 189.11, 210.1, 210.12
See application file for complete search history.

(56) References Cited

U.S. PATENT DOCUMENTS 5,375,083 A * 12/1994 Yamaguchi ............ 365/185.27
5,535,160 A * 7/1996 Yamaguchi ............ 365/189.14
5,594,692 A * 1/1997 Yamaguchi ............ 365/189.09
7,450,361 B2 * 11/2008 Ito et al. .................... 361/93.1

FOREIGN PATENT DOCUMENTS

KR   2000-0030505      6/2000
KR   10-2006-0042353 A 5/2006

OTHER PUBLICATIONS

Korean Notice of Allowance issued in Korean Patent Application No. KR 10-2007-0087609, dated Sep. 10, 2008.
Korean Office Action, with English translation, issued in Korean Patent Application No. KR 10-2007-0087609, mailed Jun. 27, 2008.

* cited by examiner

Primary Examiner—Gene N. Auduong
(74) Attorney, Agent, or Firm—IP & T Law Firm PLC

(57) ABSTRACT

A semiconductor memory device that includes a first high voltage oscillator configured to generate a first control pulse in response to a first enable signal, a level shifter configured to generate a high voltage control pulse by boosting a level of the first control pulse using a source high voltage, and a first high voltage generator configured to generate a high voltage by boosting an external power supply voltage in response to the high voltage control pulse.

20 Claims, 5 Drawing Sheets

SEMICONDUCTOR MEMORY DEVICE

CROSS-REFERENCE TO RELATED APPLICATIONS

This application claims priority of Korean patent application number 10-2007-0087609, filed on Aug. 30, 2007, which is incorporated by reference in its entirety.

BACKGROUND OF THE INVENTION

The subject matter relates to an internal voltage generating circuit of a semiconductor memory device, and more particularly, to a high-voltage generating circuit for boosting a supply voltage to generate a high voltage used in a semiconductor device.

In a system with a variety of semiconductor devices, a semiconductor memory device serves as a data storage. The semiconductor memory device outputs data corresponding to addresses received from a data processor, e.g., a central processing unit (CPU), or stores data received from the data processor into memory cells selected by addresses received from a data processor.

As the integration density of semiconductor memory devices has increased, circuits are designed based on a sub-micron design rule. Thus, circuit components of the semiconductor memory devices have become ultra-fine. Meanwhile, as the operating frequency of the CPU increases, semiconductor memory devices within systems are also designed to operate in high frequency environments. In order to achieve high frequency operation while components are becoming ultra-fine, a power supply voltage should be lowered. For example, a power supply voltage lower than 1.5 V is applied to synchronous memory devices, such as double data rate version 3 (DDR3) or higher version, which are considered current and next generation memory devices.

As the power supply voltage for the next generation memory device is lowered, internal voltages with different voltage levels than the power supply voltage are required to support various operations inside electronic devices and semiconductor memory devices. It is difficult and inefficient to receive all of the internal voltages from external circuits. Therefore, the semiconductor memory devices include internal voltage generating circuits. Generally, such an internal voltage generating circuit generates an internal voltage according to a level of an external power supply voltage. For example, an internal voltage generating circuit may generate an internal voltage having the same level as the input power supply voltage, or may generate an internal voltage having a different level from the input power supply voltage, such as one half, one quarter, or double the input power supply voltage.

Among the internal voltage generating circuits, on-chip high voltage generating circuits have become more important. A high voltage generating circuit is a circuit for generating a high voltage higher than a power supply voltage. The high voltage generating circuit is used for driving word lines (WL) connected to unit cells of the semiconductor memory device. Also, the high voltage generating circuit is used to generate a driving power for a data output buffer.

FIG. 1 is a block diagram of a conventional semiconductor memory device.

Referring to FIG. 1, the conventional semiconductor memory device includes a reference voltage generator 110, a high voltage detector 120, a high voltage oscillator 130, a high voltage generator 140, and a cell transistor 150. The cell transistor 150 is included in a unit cell for storing data. The cell transistor 150 is connected to a word line and acts as a switch to output data stored in the unit cell or store data in the unit cell. The semiconductor memory device needs internal voltages having various levels for various internal operations. Although the high voltage is used in various internal circuits of the semiconductor memory device, a representative case will be described below.

After an external power supply voltage VDD is applied, the high voltage detector 120 detects a high voltage VPP generated by the high voltage generator 140 and outputs a high voltage enable signal VPPE for enabling the high voltage generator 140 if the detected high voltage VPP does not reach a predetermined level. The high voltage oscillator 130 outputs control pulses P1 and P2 having a constant period in response to the high voltage enable signal VPPE, and the high voltage generator 140 generates a high voltage VPP in response to the control pulses P1 and P2. In addition, the reference voltage generator 110 generates a reference voltage VREF having a stable level to the high voltage detector 120. The high voltage detector 120 receives the reference voltage VREF and determines if the high voltage VPP output from the high voltage generator 140 is higher than a threshold based on reference voltage VREF.

More specifically, the reference voltage generator 110 is a basic circuit in the internal voltage generating circuit of the semiconductor memory device and generates the reference voltage VREF having a stable level (e.g., 0.8 V). The reference voltage VREF is input to the high voltage detector 120. The high voltage detector 120 receives the reference voltage VREF and the high voltage VPP, and outputs the high voltage enable signal VPPE. More specifically, the high voltage detector 120 divides the high voltage VPP and compares the divided high voltage with the reference voltage VREF. When the divided high voltage is higher than the reference voltage VREF, the high voltage detector 120 outputs the high voltage enable signal VPPE at a logic low level to disable the high voltage oscillator 130. When the divided high voltage is lower than the reference voltage VREF, the high voltage detector 120 outputs the high voltage enable signal VPPE at a logic high level to enable the high voltage oscillator 130.

The high voltage oscillator 130 receives the high voltage enable signal VPPE from the high voltage detector 120. The high voltage oscillator 130 is disabled when the high voltage enable signal VPPE is at a logic low level. That is, the first control signal P1 output from the high voltage oscillator 130 is locked to a logic low level. At this point, the second control signal P2 is locked to a logic high level. Alternatively, when the high voltage enable signal VPPE output from the high voltage detector 120 is at a logic high level, the high voltage oscillator 130 is enabled to output the first and second control signals P1 and P2 having a pulse form with a constant period.

The high voltage generator 140, receiving the first and second control signals P1 and P2 having the pulse form with the constant period, receives an external power supply voltage VDD and operates internal pumping capacitors to increase the level of the high voltage VPP. When the first control signal P1 does not have a pulse form with constant period, but is locked to a logic low level, the high voltage generator 140 does not operate internal pumping capacitors to increase the level of the high voltage VPP. Consequently, when the level of the high voltage VPP is low, the high voltage detector 120, the high voltage oscillator 130, and the high voltage generator 140 operate to boost the power supply voltage VDD by the pumping capacitor of the high voltage generator 140, thereby increasing the level of the high voltage VPP.

FIG. 2 is a circuit diagram of the high voltage generator 140 of FIG. 1.

Referring to FIG. 2, the high voltage generator 140 includes inverters 142A and 142B for inverting the control signals P1 and P2 output from the high voltage oscillator 130, pumping capacitors C0 and C1 for performing a boosting operation, and a high voltage output unit 144 for outputting the high voltage VPP generated based on the power supply voltage VDD. Specifically, the high voltage output unit 144 includes first and second MOS transistors M1 and M2 for transferring the high voltage VPP, and third to fifth transistors M3 to M5 acting as a current source for a boosting operation.

Upon operation of the high voltage generator 140, an initial VPP output node is reset to a level of VDD−Vt by the applied power supply voltage VDD. In addition, nodes R1 and R2 are also initialized to a level of VDD−Vt by the applied power supply voltage VDD. To simplify the discussion, it is assumed that the VPP output node and the nodes R1 and R2 are reset to a level of the power supply voltage VDD, without considering the threshold voltage (Vt) of the transistor.

When the first control signal P1 changes from the logic high level to the logic low level, an output node A1 of the inverter 142A changes from a logic low level to a logic high level. At this point, the level of the node R1 rises from the initial power supply voltage VDD to two times the power supply voltage, 2×VDD, by the operation of the pumping capacitor C0. Due to the second control signal P2 having a phase opposite to the first control signal, the node R2 is kept at the level of the initial power supply voltage VDD. Hence, the first MOS transistor M1 is turned on and two times the power supply voltage, 2×VDD, is transferred to the VPP output node.

Likewise, when the second control signal P2 changes from the logic high level to the logic low level, the output node A2 of the inverter changes from a logic low level to a logic high level. At this point, the level of the node R2 rises from the power supply voltage VDD to two times the power supply voltage, 2×VDD, by the operation of the pumping capacitor C1. Since the first control signal P1 has a phase opposite to the second control signal P2, the node B1 falls from two times the power supply voltage 2×VDD to the power supply voltage VDD. Hence, the second MOS transistor M2 is turned on and two times the power supply voltage 2×VDD is transferred to the VPP output node.

FIG. 3 is a graph depicting the operation of the semiconductor memory device of FIG. 1.

The generation of the high voltage VPP after the power supply voltage VDD is applied is shown in FIG. 3. In the initial operation of the semiconductor memory device, the power supply voltage rises from a low level to a target level. The pumping capacitor repetitively boosts the power supply voltage VDD and the high voltage VPP rises from an initial low level to a VPP target level. That is, the high voltage VPP rises up to the VPP target voltage while the VPP output node of the semiconductor memory device is charged by the continuous pumping operation.

The pumping capacitors C0 and C1 having the relationship of Q=CV have relatively smaller capacitances than those of various loads connected to the VPP output node within the semiconductor memory device. Therefore, several pumping operations must be performed in order to increase the level of the VPP output node up to the VPP target level. However, the actual operation of the semiconductor memory device cannot wait a long time for the high voltage VPP to be charged up to the VPP target level after the input of the power supply voltage VDD.

Hence, the pumping capacitors C0 and C1 must have large capacitances in order to increase the high voltage VPP up to the target voltage level within a predetermined time. Accordingly, the capacitors C0 and C1 must be designed with large sizes. Consequently, a total size of the semiconductor memory device increases, which negatively affects the design of the high-integrated semiconductor memory device.

SUMMARY OF THE INVENTION

Embodiments of the present invention are directed to providing an internal voltage generating circuit, which can internally boost a power supply voltage within a semiconductor memory device. Therefore, the internal voltage generating circuit can increase the boosting capability so that time necessary for boosting is reduced without increasing the size of a high voltage generating circuit, and can support a high-speed high-integrated semiconductor memory device.

In accordance with an aspect of the present invention, there is provided a semiconductor memory device that includes a first high voltage oscillator configured to generate a first control pulse in response to a first enable signal, a level shifter configured to generate a high voltage control pulse by boosting a level of the first control pulse using a source high voltage and a first high voltage generator configured to generate a high voltage by boosting an external power supply voltage in response to the high voltage control pulse. In accordance with another aspect of the present invention, there is provided a semiconductor memory device that includes a first high voltage generating circuit configured to generate a high voltage by boosting an external power supply voltage using a high voltage control pulse having a voltage level corresponding to a source high voltage, a second high voltage generating circuit configured to generate the source high voltage by boosting the power supply voltage, a level shifter configured to generate the high voltage control pulse by boosting a first control pulse using the source high voltage and a word line driver configured to supply the high voltage to a word line connected to a unit cell.

In an electronic device and a semiconductor memory device, an internal voltage generating circuit for generating a high voltage necessary for internal operations by boosting a power supply voltage has a disadvantage in that a total size of the semiconductor memory device increases because a capacitor having a large capacitance is required to reduce time necessary to generate a high voltage after a power supply voltage is applied. To solve this problem, a boosted pumping control signal is input in order to increase the boosting capability, so that time necessary for boosting is reduced without increasing the size of the high voltage generating circuit. Specifically, the level of the boosting control signal is increased and input to the capacitor of the high voltage generator included in the semiconductor memory device. In this way, time necessary to boost the high voltage up to the target level can be reduced and the level of the high voltage (VPP) can be rapidly recovered even though it falls below a predetermined level.

DETAILED DESCRIPTION

Hereinafter, a semiconductor memory device in accordance with exemplary embodiments of the present invention will be described in detail with reference to the accompanying drawings.

Figure 4:
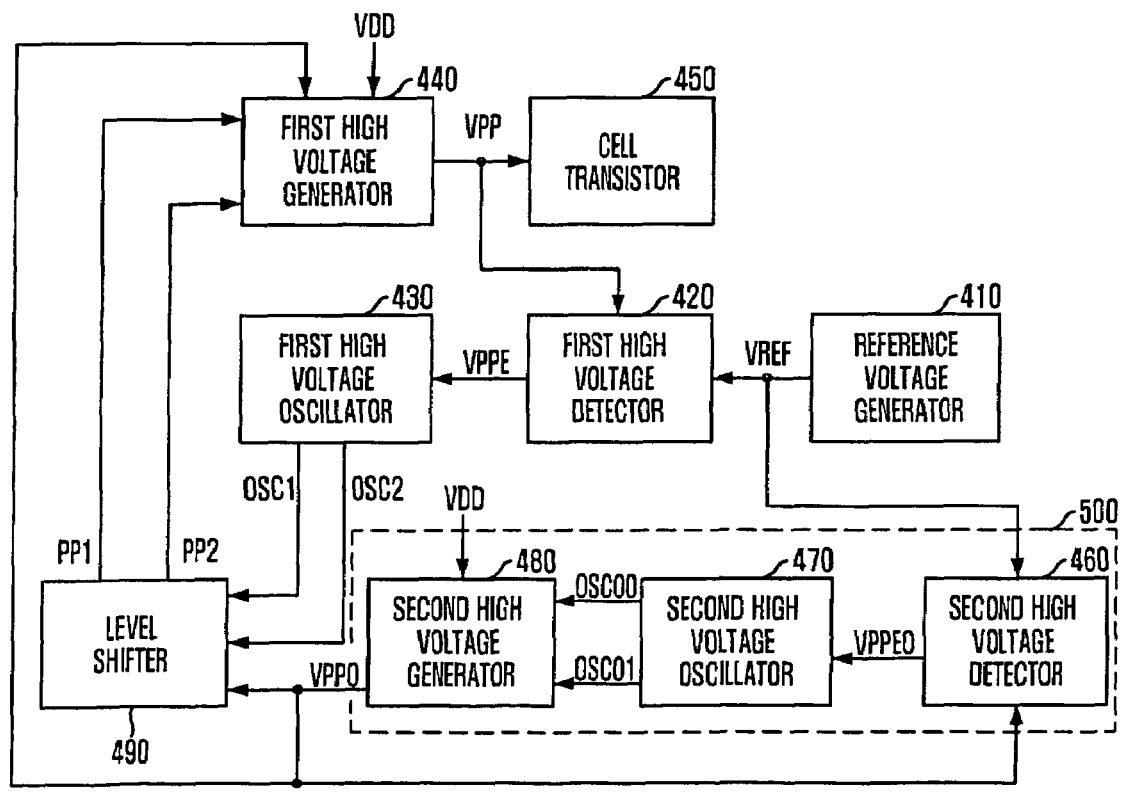
FIG. 4 is a block diagram of a semiconductor memory device in accordance with an embodiment of the present invention.

FIG. 4 is a block diagram illustrating a semiconductor memory device in accordance with an embodiment of the present invention.

Referring to FIG. 4, the semiconductor memory device includes a reference voltage generator 410, a first high voltage detector 420, a first high voltage oscillator 430, a first high voltage generator 440, a cell transistor 450, a level shifter 490, and a source voltage generator 500. The source voltage generator 500 includes a second high voltage detector 460, a second high voltage oscillator 470, and a second high voltage generator 480. Although the cell transistor 450 is described herein as one example, the high voltage may also be used in various internal components of the semiconductor memory device because internal voltages having various levels are needed for the internal operations of the semiconductor memory device.

Figure 1:
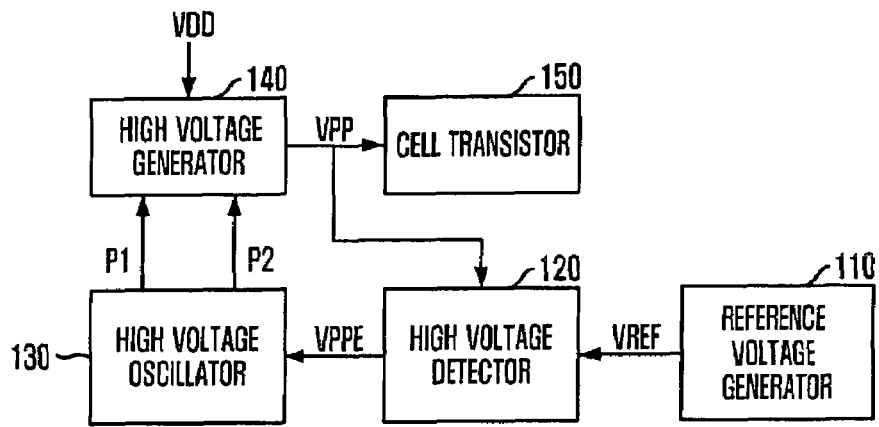
FIG. 1 is a block diagram of a conventional semiconductor memory device.

In contrast with a conventional device, the semiconductor memory device in accordance with the embodiment illustrated in FIG. 4 further includes the level shifter 490 configured to generate high voltage control pulses PP1 and PP2 by boosting first control pulses OSC1 and OSC2 for controlling the first high voltage generator 440, and the source voltage generator 500 configured to boost the power supply voltage VDD and supply a source high voltage VPP0 to the level shifter 490 in order to generate the high voltage control pulses PP1 and PP2. Since the structures and functions of the reference voltage generator 410, the first high voltage detector 420, the first high voltage oscillator 430, and the first high voltage generator 440 illustrated in FIG. 4 correspond to those of the reference voltage generator 110, the high voltage detector 120, the high voltage oscillator 130, and the high voltage generator 140 illustrated in FIG. 1, detailed description thereof will be omitted for convenience of explanation.

After the external power supply voltage VDD is applied, the first high voltage detector 420 detects the high voltage VPP generated by the first high voltage generator 440 and outputs a first enable signal VPPE when the detected high voltage VPP does not reach a predetermined level. The first high voltage oscillator 430 outputs the first control pulses OSC1 and OSC2 having a constant period in response to the first enable signal VPPE. The level shifter 490 boosts the first control pulses OSC1 and OSC2 in response to the source high voltage VPP0.

The source high voltage VPP0 is generated by boosting the power supply voltage VDD. First, the second high voltage detector 460 compares the source high voltage VPP0 with the reference voltage VREF output from the reference voltage generator 410 and determines if the source high voltage VPP0 is kept at a desired level. The source high voltage VPP0 may be kept at a level substantially equal to the high voltage VPP, or may be kept at a level lower than the high voltage VPP and higher than the power supply voltage VDD. The second high voltage detector 460 divides the source high voltage VPP0 at a ratio lower than or equal to a high voltage division ratio of the first high voltage detector 420 according to the level of the source high voltage VPP0, and compares the divided source high voltage with the reference voltage VREF. The second high voltage detector 460 may differ from the first high voltage detector 420 in the voltage division ratio but they can be configured with a similar structure. Hence, the second high voltage detector 460 can perform the comparison operation like the first high voltage detector 420 by using the reference voltage VREF output from the reference high voltage detector 410, without requiring a separate reference voltage.

The second enable signal VPPE0 output from the second high voltage detector 460 is input to the second high voltage oscillator 470. The second high voltage oscillator 470 generates second control pulses OSC00 and OSC01 in response to the second enable signal VPPE0. Since the structure and function of the second high voltage oscillator 470 are very similar to those of the first high voltage oscillator 430, a detailed description is omitted.

The second high voltage generator 480 boosts the power supply voltage VDD to generate the source high voltage VPP0 in response to the second control pulses OSC00 and OSC01. In this case, when it is assumed that the second high voltage generator 480 has essentially the same structure as the high voltage generator 140 of FIG. 1 and the threshold voltage of the transistor is not considered, the second high voltage generator 480 can output the source high voltage VPP0 having maximally two times the power supply voltage, 2×VDD, to the level shifter 490, like the high voltage generator 140 of FIG. 1.

The level shifter 490 receives the source high voltage VPP0 and the first control pulses OSC1 and OSC2 to generate the high voltage control pulses PP1 and PP2 for the first high voltage generator 440. The first high voltage generator 440 generates the high voltage VPP by boosting the external power supply voltage VDD by the level of the high voltage control pulses PP1 and PP2. In a conventional semiconductor memory device, the high voltage generator can output the high voltage boosted up to two times the power supply voltage VDD when the threshold voltage of the transistor is not considered. However, in accordance with the embodiment of the present invention, the first high voltage generator 440 can boost the power supply voltage VDD by the source high voltage VPP0. Therefore, the high voltage VPP can have a level corresponding to the sum of the power supply voltage VDD and the source high voltage VPP0, that is, VPP=VDD+VPP0. As described above, since the source high voltage VPP0 can have the level of up to two times the power supply voltage VDD, that is, VPP0=2×VDD, the first high voltage generator 440 can output a high voltage of up to three times the power supply voltage VDD, that is, VPP=VDD+VPP0=VDD+2×VDD=3×VDD. Although the threshold voltage of the transistor within the semiconductor memory device is ignored for convenience of explanation, the high voltage generating circuit in accordance with the embodiment of the present invention can have higher boosting capability than the related art in the actual environment where the threshold voltage of the transistor is considered. In particular, the high voltage generating circuit in accordance with the embodiment of the present invention can have high boosting capability by using the source high voltage generator 500 without changing the capacitances of the pumping capacitors included in the first high voltage generator 440. Therefore, it is unnecessary to increase the size of the capacitor in order to increase the boosting capability, thereby better supporting high-integrated semiconductor memory devices. Since the size of the capacitor in the actual semiconductor memory device is significantly larger than the size of the transistor, the present embodiment has an advantage in integration degree and stability over conventional devices in which the high voltage VPP is generated by increasing the size of the capacitor included in the first high voltage generator, even when the total size of the source high voltage generator 500 is considered.

Figure 5:
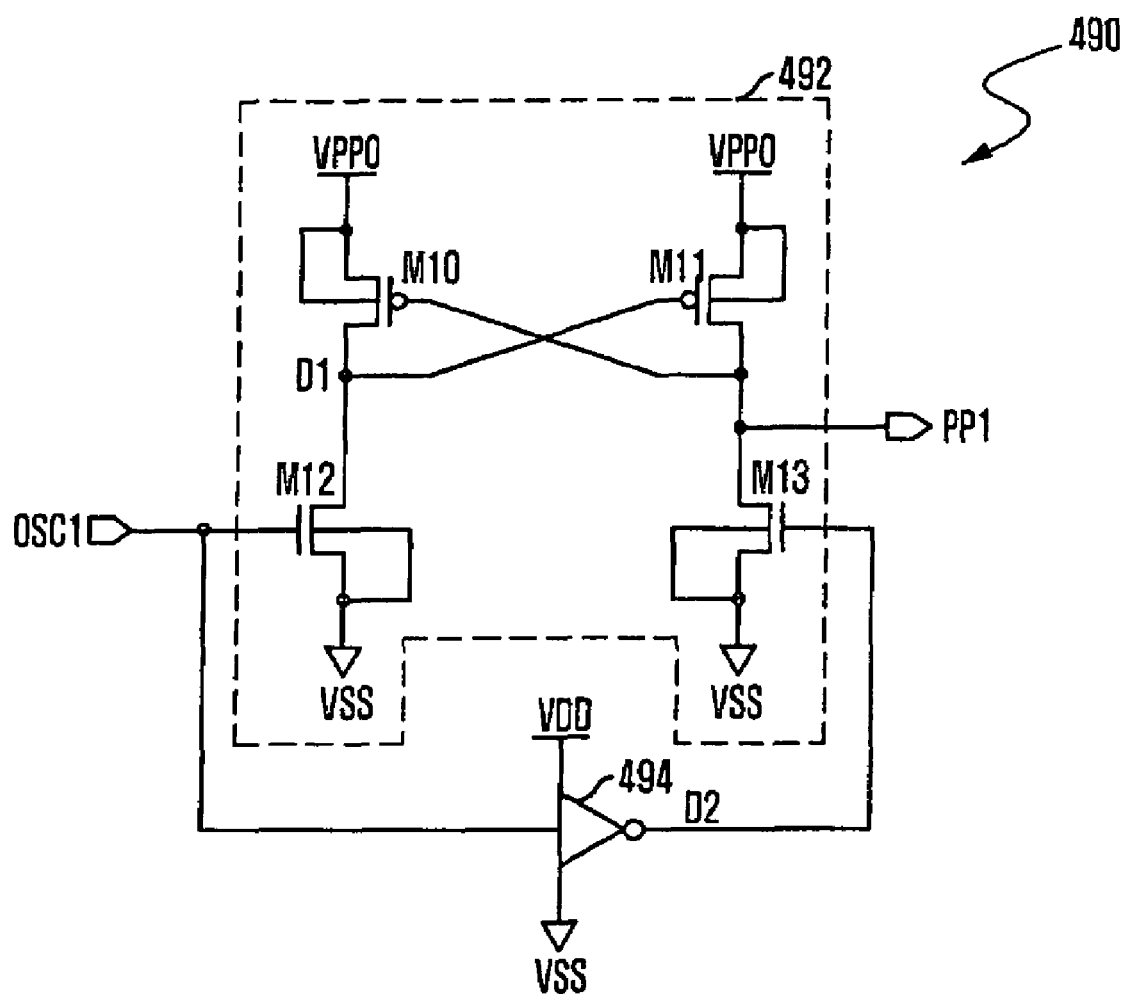
FIG. 5 is a circuit diagram of a level shifter of FIG. 4.

Hereinafter, the operation of the level shifter will be described. FIG. 5 is a circuit diagram of a portion of the level shifter 490 of FIG. 4.

Referring to FIG. 5, the level shifter 490 includes an inverter 494 for inverting one pulse OSC1 of the first control pulses, and a cross-coupled circuit 492 for selecting the source high voltage VPP0 or the ground voltage VSS in response to the control pulse OSC1 and the output of the inverter 494 and outputting the high voltage control pulse PP1. The level shifter 490 of FIG. 5 outputs the high voltage control pulse PP1 by boosting one of the first control pulse OSC1. The level shifter for the other pulse can be configured with the same structure. The cross-coupled circuit 492 includes PMOS transistors M10 and M11 having sources connected to the source high voltage VPP0, and gates and drains cross-coupled; and NMOS transistors M12 and M13 respectively having gates receiving the pulse OSC1 and the output of the inverter 494, drains connected to the ground voltage VSS, and sources connected to the drains of the PMOS transistors M10 and M11.

When the pulse OSC1 is at a logic high level, the first NMOS transistor M12 is turned on. Thus, a node D1 becomes a logic low level and the second PMOS transistor M11 is turned on. Since the output D2 of the inverter 494 is at a logic low level, the second NMOS transistor M13 is turned off and thus the source high voltage VPP0 connected to the source of the second PMOS transistor M11 is output as the high voltage control pulse PP1. Thereafter, when the first control pulse OSC1 becomes a logic low level, the first NMOS transistor M12 is turned off and the output D2 of the inverter 494 is at a logic high level. Therefore, the second NMOS transistor M13 is turned on and the ground voltage VSS connected to the source of the second NMOS transistor M13 is output as the high voltage control pulse PP1. Through these processes, when the first control pulses OSC1 and OSC2 pass through the level shifter 490, the first control pulses OSC1 and OSC2 changing between the ground voltage VSS and the power supply voltage VDD, become the high voltage control pulses PP1 and PP2 changing between the ground voltage VSS and the source high voltage VPP0. Accordingly, explain about another embodiment of the circuit of the level shifter 490 receives a OSC2 and outputs a PP2 will be omitted.

Figure 6:
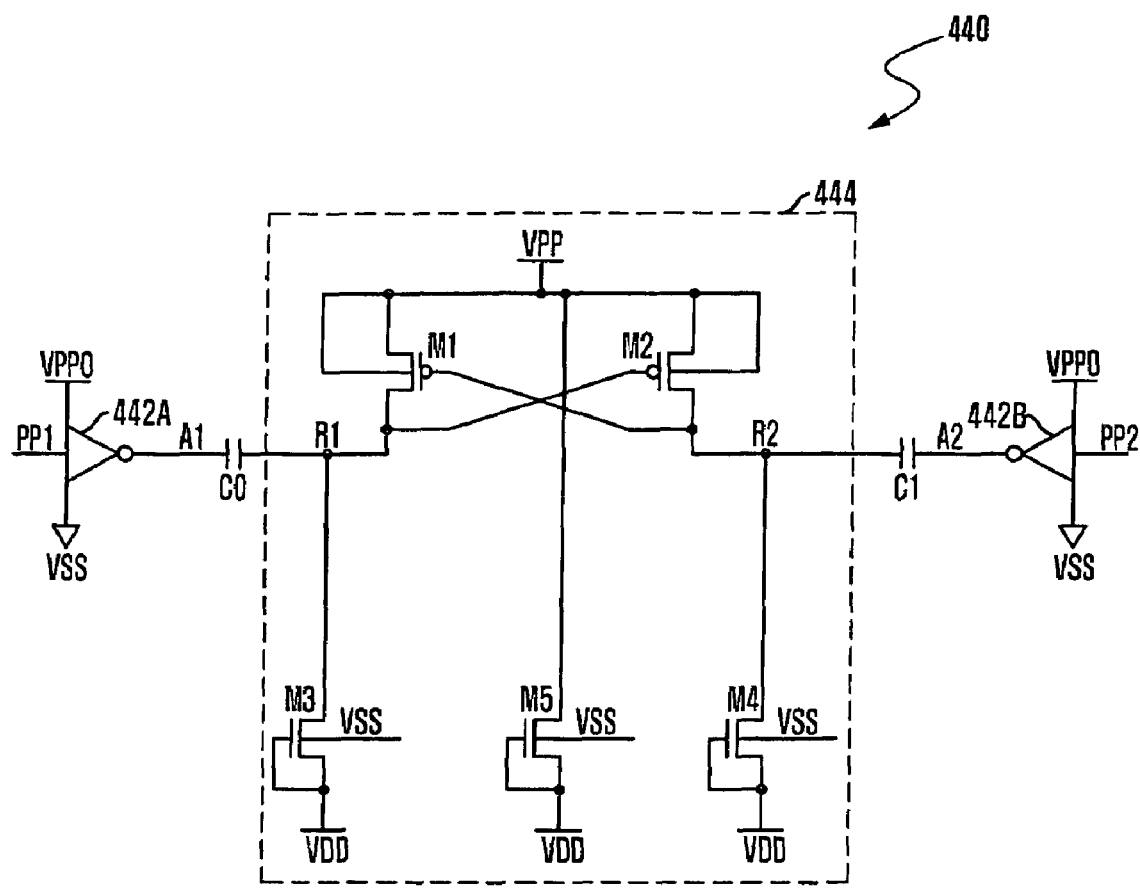
FIG. 6 is a circuit diagram of a first high voltage detector of FIG. 4.

FIG. 6 is a circuit diagram of the first high voltage detector 420 of FIG. 4. In this embodiment, the first high voltage detector 420 has a structure similar to the high voltage detector 120 of FIG. 1 in one example.

Figure 2:
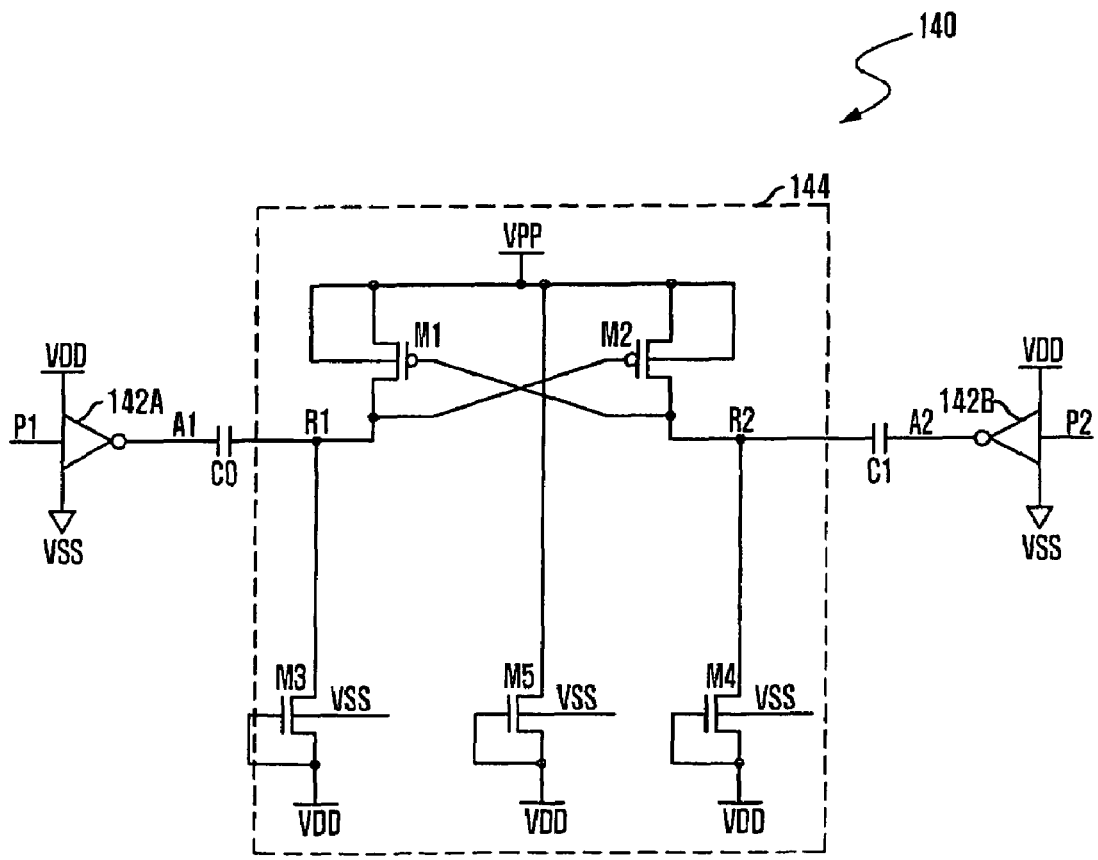
FIG. 2 is a circuit diagram of a high voltage generator of FIG. 1.
Figure 3:
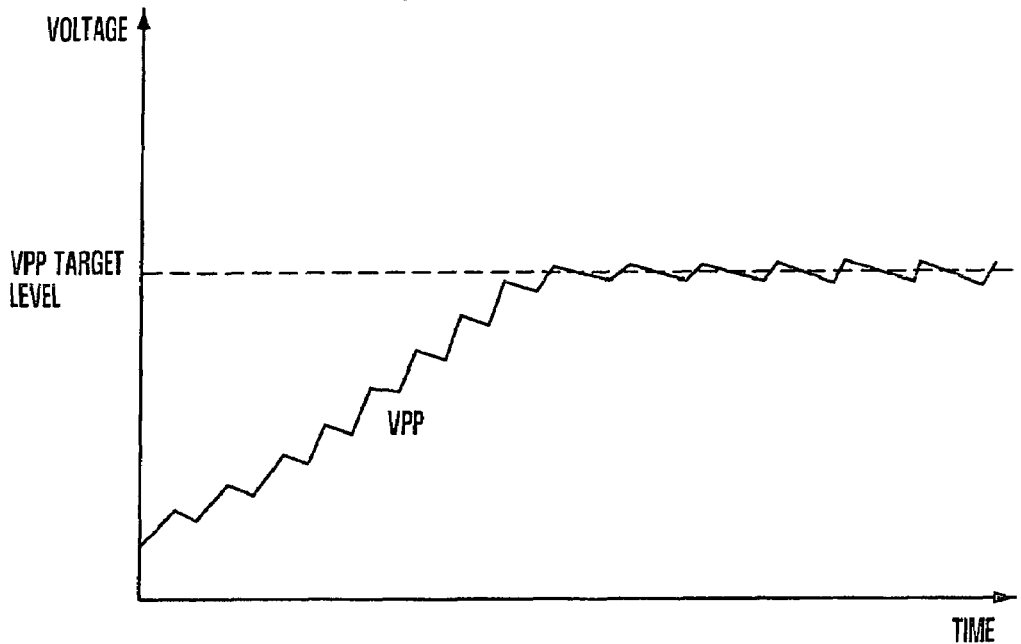
FIG. 3 is a graph for explaining the operation of the semiconductor memory device of FIG. 1.

Referring to FIG. 6, the first high voltage detector 420 includes supply inverters 442A and 442B respectively for inverting the high voltage control pulses PP1 and PP2 output from the level shifter 490, pumping capacitors C0 and C1 for the boosting operation, and a high voltage output unit 444 for outputting the high voltage VPP having a level boosted by the level of the high voltage control pulses PP1 and PP2, based on the power supply voltage VDD. Since the high voltage output unit 444 is configured with the same structure as high voltage output unit 144 illustrated in FIG. 2 with respect to a conventional device, its detailed description will be omitted.

Unlike the conventional device, the first high voltage detector 420 must transfer the source high voltage VPP0 of the high voltage control pulses PP1 and PP2 to the pumping capacitors C0 and C1. Therefore, the supply inverters 442A and 442B are operated using not the general power supply voltage VDD but the source high voltage VPP0 output from the second high voltage generator 480.

Figure 7:
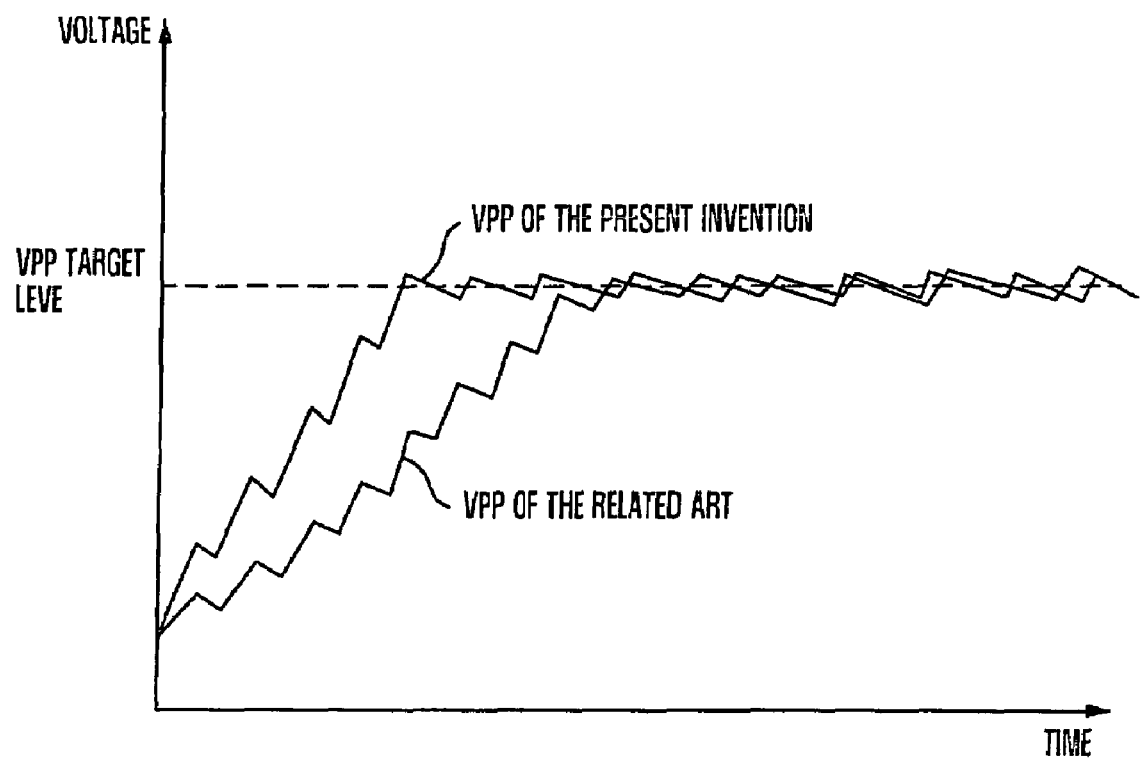
FIG. 7 is a waveform diagram illustrating the operation of the semiconductor memory device of FIG. 4.

FIG. 7 is a waveform diagram illustrating the operation of the semiconductor memory device illustrated in FIG. 4.

As can be seen from FIG. 7, the boosting capability of the high voltage generating circuit within the semiconductor memory device is further improved than the conventional device. Compared to a conventional device, the high voltage VPP output from the first high voltage generator 440 is boosted at a higher rise rate whenever the boosting operation is performed.

More specifically, the initial VPP output node is reset to the level of VDD−Vt after the power supply voltage VDD is applied. Since the initial level of the high voltage VPP is lower than the target voltage level, the first and second high voltage detectors 420 and 460 activate the first and second enable signals VPPE and VPPE0, and the level shifter 490 outputs the high voltage control pulses PP1 and PP2 in response to the first and second enable signals VPPE and VPPE0. The first high voltage generator 440 can transfer the voltage of VDD+VPP0 to the VPP output node in response to the high voltage control pulses PP1 and PP2. That is, the high voltage generator can transfer the voltage higher than two times the power supply voltage, 2×VDD. The increase of the voltage at the high rise rate results in the improvement of the boosting capability.

Therefore, in the pumping capacitor's relationship of Q=CV, the target high voltage for VPP can be reached more rapidly by increasing the rise rate of the voltage level, without increasing the size of the capacitor C.

Furthermore, when intending to obtain the same boosting capability (charging capability: Q) while further increasing the rise rate of the voltage level, it means that the size of the capacitor C can be reduced. In this case, the circuit area of the semiconductor memory device can be reduced.

In accordance with embodiments of the present invention, the semiconductor memory device can reduce the time necessary to boost the power supply voltage up to the target level by improving the boosting capability, without increasing the size of the high voltage generating circuit.

Furthermore, the semiconductor memory device can rapidly stabilize the level of the high voltage in the initial operation, thereby improving the entire operating speed. Therefore, even when the level of the high voltage falls, it can be rapidly recovered, thereby increasing the reliability of internal operations and ensuring stable operation.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a first high voltage oscillator configured to generate a first control pulse in response to a first enable signal;
a level shifter configured to generate a high voltage control pulse by boosting a level of the first control pulse using a source high voltage; and
a first high voltage generator configured to generate a high voltage by boosting an external power supply voltage in response to the high voltage control pulse.

2. The semiconductor memory device as recited in claim 1, further comprising a first high voltage detector configured to activate the first enable signal when the high voltage generated by the first high voltage generator does not reach a first predetermined target level.

3. The semiconductor memory device as recited in claim 2, further comprising a reference voltage generator configured to generate a reference voltage that is compared with the high voltage in order to determine if the high voltage reaches the first predetermined target level.

4. The semiconductor memory device as recited in claim 3, further comprising a source high voltage generator configured to compare the reference voltage with the source high voltage and supply the level shifter with the source high voltage at a level higher than a second predetermined target level.

5. The semiconductor memory device as recited in claim 4, wherein the first high voltage generator comprises:
   a pumping capacitor configured to perform a boosting operation;
   an inverter configured to invert the high voltage control pulse by using the source high voltage as a driving voltage and supply the inverted high voltage control pulse to the pumping capacitor; and
   a high voltage output unit configured to transfer a voltage applied to one terminal of the pumping capacitor.

6. The semiconductor memory device as recited in claim 4, wherein the source high voltage generator comprises:
   a second high voltage detector configured to compare the source high voltage with the reference voltage to generate a second enable signal;
   a second high voltage oscillator configured to generate a second control pulse in response to the second enable signal; and
   a second high voltage generator configured to generate the source high voltage by boosting the external power supply voltage in response to the second control pulse.

7. The semiconductor memory device as recited in claim 6, wherein the level of the source high voltage is substantially equal to that of the high voltage.

8. The semiconductor memory device as recited in claim 6, wherein the level of the source high voltage is higher than that of the external power supply voltage and lower than that of the high voltage.

9. The semiconductor memory device as recited in claim 4, wherein the level shifter comprises:
   an inverter configured to invert the first control pulse; and
   a cross-coupled circuit configured to select the source high voltage or a ground voltage in response to the first control pulse and the output of the inverter, and output the high voltage control pulse.

10. The semiconductor memory device as recited in claim 9, wherein the cross-coupled circuit comprises:
   two PMOS transistors having sources connected to the source high voltage, and gates and drains cross-coupled; and
   two NMOS transistors each having a gate respectively receiving the first control pulse and the output of the inverter, drains connected to the ground voltage, and sources connected to the drains of the PMOS transistors.

11. A semiconductor memory device, comprising:
   a first high voltage generating circuit configured to generate a high voltage by boosting an external power supply voltage using a high voltage control pulse having a voltage level corresponding to a source high voltage;
   a second high voltage generating circuit configured to generate the source high voltage by boosting the power supply voltage;
   a level shifter configured to generate the high voltage control pulse by boosting a first control pulse using the source high voltage; and
   a word line driver configured to supply the high voltage to a word line connected to a unit cell.

12. The semiconductor memory device as recited in claim 11, wherein the first high voltage generating circuit comprises:
   a first high voltage oscillator configured to generate the first control pulse in response to a first enable signal; and
   a first high voltage generator configured to generate the high voltage by boosting the external power supply voltage by a voltage level of the source high voltage.

13. The semiconductor memory device as recited in claim 12, wherein the first high voltage generator comprises:
   a pumping capacitor for performing a boosting operation;
   an inverter configured to invert the high voltage control pulse by using the source high voltage as a driving voltage and supply the inverted high voltage control pulse to the pumping capacitor; and
   a high voltage output unit configured to transfer a voltage applied to one terminal of the pumping capacitor.

14. The semiconductor memory device as recited in claim 12, wherein the first high voltage generating circuit further comprises a first high voltage detector configured to activate the first enable signal when the high voltage output from the high voltage generator does not reach a predetermined target level.

15. The semiconductor memory device as recited in claim 12, wherein the first high voltage generating circuit further comprises a reference voltage generator configured to generate a reference voltage that is compared with the high voltage in order to determine if the high voltage reaches a predetermined target level.

16. The semiconductor memory device as recited in claim 15, wherein the second high voltage generating circuit comprises:
   a second high voltage detector configured to compare the source high voltage with the reference voltage to output a second enable signal;
   a second high voltage oscillator configured to generate a second control pulse in response to the second enable signal; and
   a second high voltage generator configured to generate the source high voltage by boosting the power supply voltage in response to the second control pulse.

17. The semiconductor memory device as recited in claim 16, wherein the level of the source high voltage is substantially equal to that of the high voltage.

18. The semiconductor memory device as recited in claim 16, wherein the level of the source high voltage is higher than that of the power supply voltage and lower than that of the high voltage.

19. The semiconductor memory device as recited in claim 15, wherein the level shifter comprises:
   an inverter configured to invert the first control pulse; and
   a cross-coupled circuit configured to select the source high voltage or a ground voltage in response to the first control pulse and the output of the inverter, and output the high voltage control pulse.

20. The semiconductor memory device as recited in claim 19, wherein the cross-coupled circuit comprises:
   two PMOS transistors having sources connected to the source high voltage, and gates and drains cross-coupled; and
   two NMOS transistors each having a gate respectively receiving the first control pulse and the output of the inverter, drains connected to the ground voltage, and sources connected to the drains of the PMOS transistors.

* * * * *